US012219230B2

(12) United States Patent
Abe et al.

(10) Patent No.: US 12,219,230 B2
(45) Date of Patent: Feb. 4, 2025

(54) ELECTRONIC DEVICE, IMAGING APPARATUS, AND MOBILE BODY

(71) Applicant: KYOCERA Corporation, Kyoto (JP)

(72) Inventors: Hiroyuki Abe, Yokohama (JP); Kazuki Shirato, Kawasaki (JP)

(73) Assignee: KYOCERA Corporation, Kyoto (JP)

( * ) Notice: Subject to any disclaimer, the term of this patent is extended or adjusted under 35 U.S.C. 154(b) by 0 days.

(21) Appl. No.: 18/512,442

(22) Filed: Nov. 17, 2023

(65) Prior Publication Data

US 2024/0089572 A1    Mar. 14, 2024

Related U.S. Application Data

(63) Continuation of application No. 17/438,689, filed as application No. PCT/JP2020/010835 on Mar. 12, 2020, now Pat. No. 11,863,852.

(30) Foreign Application Priority Data

Mar. 20, 2019   (JP) .................. 2019-053726

(51) Int. Cl.
| H04N 23/54 | (2023.01) |
| H04N 23/51 | (2023.01) |
| H04N 23/52 | (2023.01) |
| H04N 23/57 | (2023.01) |
| H05K 1/18  | (2006.01) |

(52) U.S. Cl.
CPC ............ *H04N 23/54* (2023.01); *H04N 23/51* (2023.01); *H04N 23/52* (2023.01); *H04N 23/57* (2023.01); *H05K 1/181* (2013.01); *H05K 2201/10151* (2013.01)

(58) Field of Classification Search
CPC ........ H04N 23/54; H04N 23/51; H04N 23/52; H04N 23/57; H05K 1/181; H05K 2201/10151; G03B 17/55
See application file for complete search history.

(56) References Cited

U.S. PATENT DOCUMENTS

| 8,970,700 | B2 | 3/2015 | Inoue et al. |
| 10,071,696 | B2 | 9/2018 | Park |
| 2011/0298925 | A1* | 12/2011 | Inoue ............... H04N 23/52 |
| | | | 348/148 |

FOREIGN PATENT DOCUMENTS

| EP | 3 163 864 A1 | 5/2017 |
| JP | 2011-259101 A | 12/2011 |
| JP | 2017-098891 A | 6/2017 |
| WO | 2013/150621 A1 | 10/2013 |

OTHER PUBLICATIONS

Merriam-Webster definition for "abut", 2024, retrieved from https://www.merriam-webster.com/dictionary/abut on Jun. 12, 2024 (Year: 2024).*

* cited by examiner

*Primary Examiner* — Timothy J Henn
(74) *Attorney, Agent, or Firm* — Studebaker & Brackett PC

(57) ABSTRACT

An imaging apparatus comprises a third substrate including a third connector; a third shield portion configured to cover a side surface of at least portions of the third substrate; a leg portion formed at an end of the third shield portion on the side of a direction away from the third substrate; a fourth connector configured to be able to be fitted to the third connector; a third metal plate configured to abut the leg portion; and a second housing including the fourth connector and the third metal plate.

5 Claims, 15 Drawing Sheets

ELECTRONIC DEVICE, IMAGING APPARATUS, AND MOBILE BODY

CROSS REFERENCES TO RELATED APPLICATIONS

The present application is a Continuation of U.S. patent application Ser. No. 17/438,689, filed on Sep. 13, 2021, which is the U.S. National Stage of International Application No. PCT/JP2020/010835, filed on Mar. 12, 2020, which claims priority of Japanese Patent Application No. 2019-053726, filed on Mar. 20, 2019, in Japan, the entire disclosure of the earlier application is incorporated herein by reference.

TECHNICAL FIELD

The present disclosure relates to an electronic device, an imaging apparatus, and a mobile body.

BACKGROUND ART

Electronic devices such as onboard cameras are required to be downsized and to perform various processing at a high speed. As a result of a circuit board being multilayered and highly-integrated for downsizing, radiation noise and the amount of heat generated by an electronic device of the circuit board are increased. There is proposed a configuration in which the entirety of the side surface of a circuit board is covered by a shield member and in which the circuit board and a heat conduction member abut each other via a heat conduction member made of a soft material such as silicone gel (refer to PTL 1).

CITATION LIST

Patent Literature

PTL 1: Japanese Unexamined Patent Application No. 2011-259101

SUMMARY

An imaging apparatus according to the present disclosure comprises a third substrate including a third connector; a third shield portion configured to cover a side surface of at least portions of the third substrate; a leg portion formed at an end of the third shield portion on the side of a direction away from the third substrate; a fourth connector configured to be able to be fitted to the third connector; a third metal plate configured to abut the leg portion; and a second housing including the fourth connector and the third metal plate.

DESCRIPTION OF EMBODIMENTS

Hereinafter, an embodiment of an electronic device to which the present disclosure is applied will be described with reference to the drawings.

Figure 1:
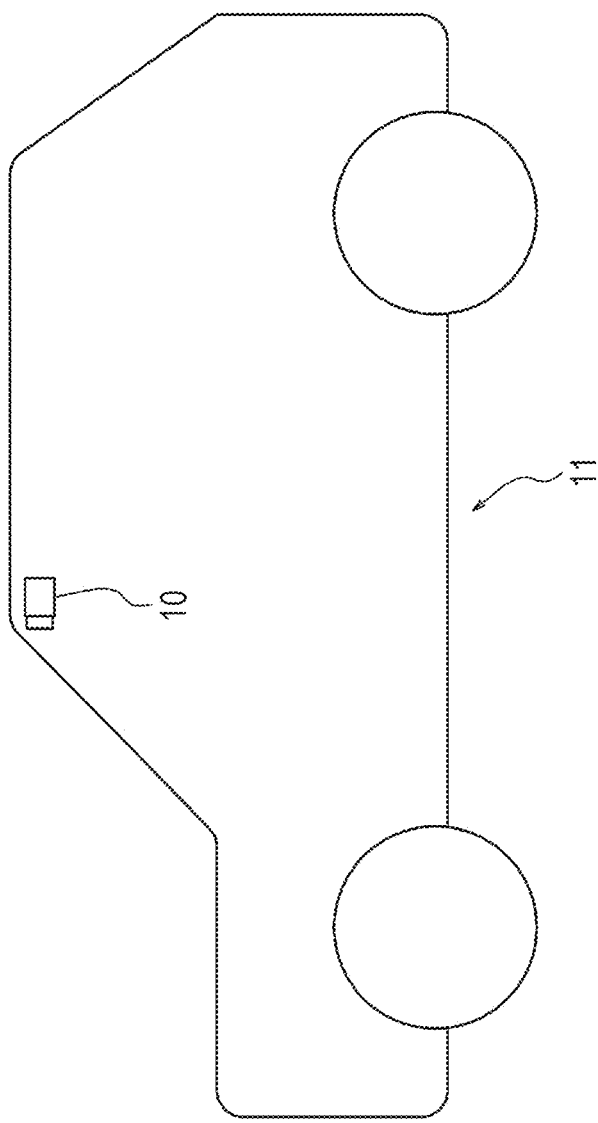
FIG. 1 is an arrangement diagram illustrating a mounting position of an electronic device according to a present embodiment in a mobile body.

Specifically, an electronic device according to one embodiment of the present disclosure is, for example, an imaging apparatus. As illustrated in FIG. 1, an electronic device 10 applied to the imaging apparatus according to the present embodiment is, for example, mounted on a mobile body 11.

The mobile body 11 may include, for example, vehicles, marine vessels, aircrafts, and the like. Vehicles may include, for example, automobiles, industrial vehicles, railway vehicles, living vehicles, fixed-wing aircrafts that travel on runways, and the like. Automobiles may include, for example, passenger cars, trucks, buses, bicycles, trolley buses, and the like. Industrial vehicles may include, for example, industrial vehicles for agriculture and construction, and the like. Industrial vehicles may include, for example, forklifts, golf carts, and the like. Industrial vehicles for agriculture may include, for example, tractors, cultivators, transplanters, binders, combine harvesters, lawnmowers, and the like. Industrial vehicles for construction may include, for example, bulldozers, scrapers, power shovels, crane trucks, dump trucks, road rollers, and the like. Vehicles may include man-powered vehicles. Classification of vehicles is not limited to the above examples. For example, automobiles may include industrial vehicles that can travel on roads. The same vehicles may be included in a plurality of categories. Marine vessels may include, for example, jet skis, boats, tankers, and the like. Aircrafts may include, for example, fixed-wing aircrafts, rotary-wing aircrafts, and the like.

Figure 2:
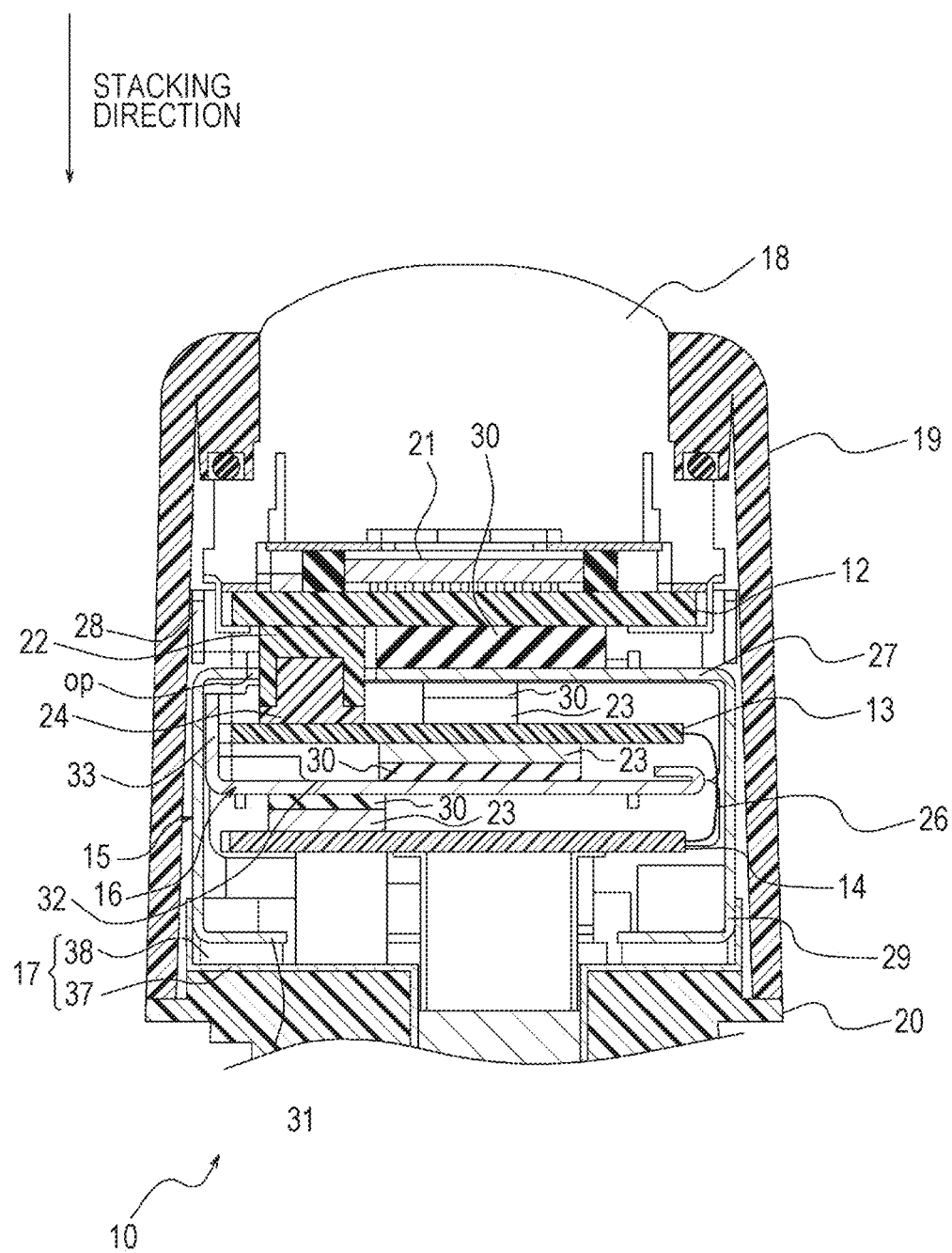
FIG. 2 is a sectional view illustrating a general configuration of the electronic device in FIG. 1, the sectional view being cut to pass through an optical axis of an imaging optical system.
Figure 3:
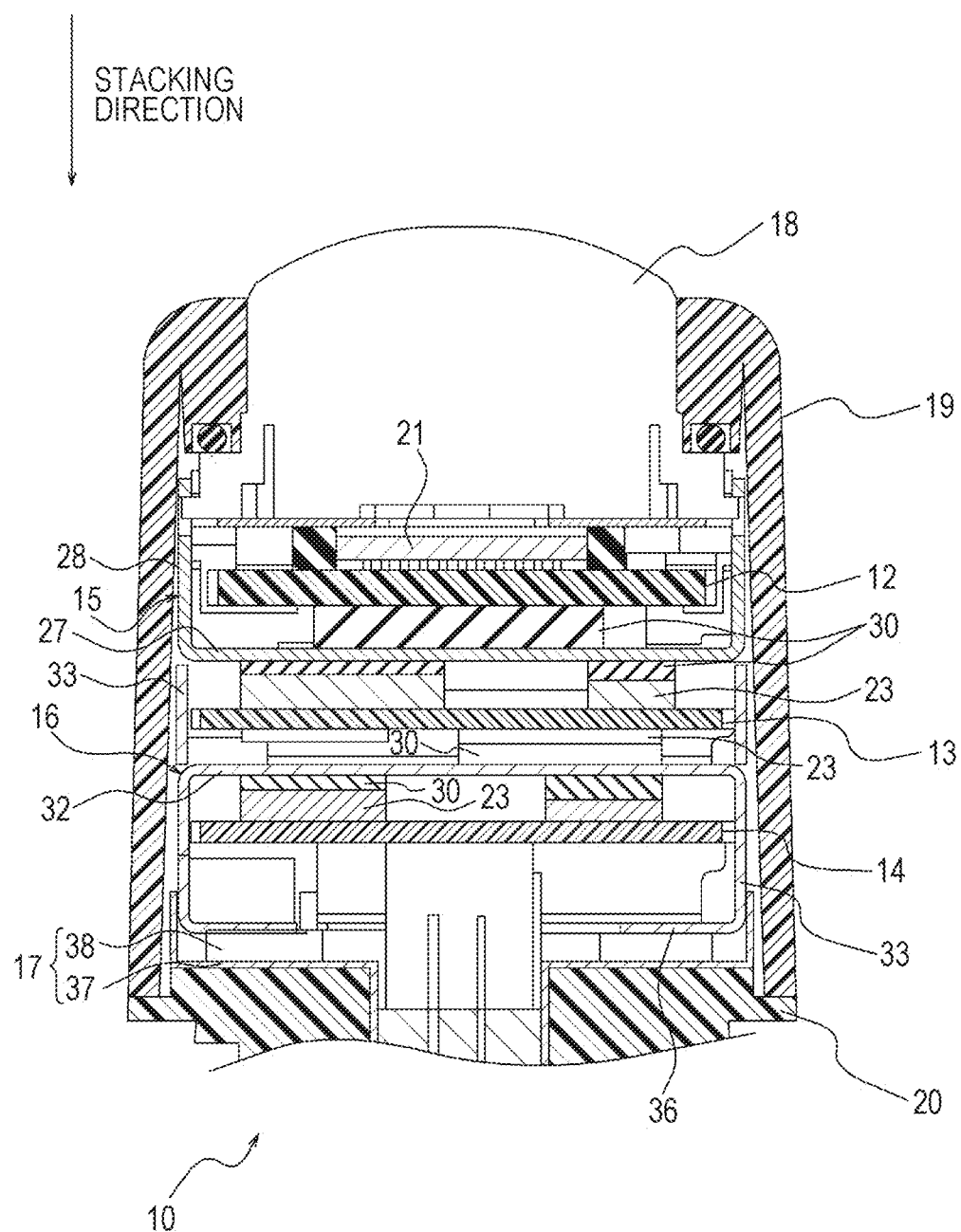
FIG. 3 is a sectional view in which the electronic device in FIG. 1 is rotated around the optical axis by 90° from that in the section in FIG. 2.

As illustrated in FIG. 2 and FIG. 3, the electronic device 10 includes a first substrate 12, a second substrate 13, a third substrate 14, a first metal plate 15, and a second metal plate 16. The electronic device 10 may further include a heat conductor 17, an imaging optical system 18, a first housing 19, and a second housing 20.

Figure 4:
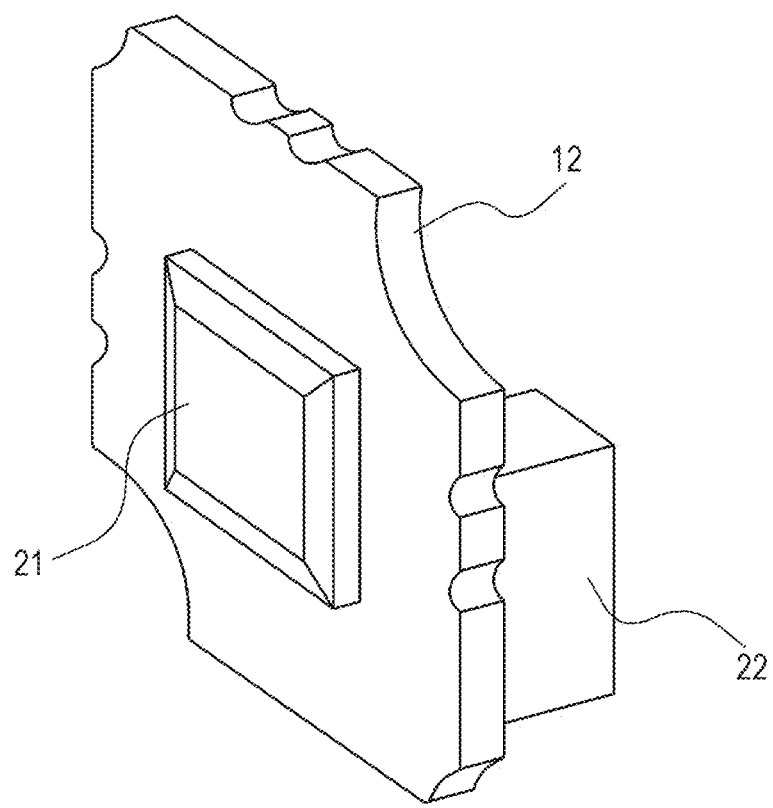
FIG. 4 is a perspective view illustrating an appearance of a first substrate in FIG. 2 and FIG. 3.

As illustrated in FIG. 4, the first substrate 12 has a flat shape. The first substrate 12 may have a substantially rectangular shape. As illustrated in FIG. 2 and FIG. 3, an imaging element 21 as an electronic component is mounted on the first substrate 12 on a side opposite to a surface facing a first flat portion, which will be described later. The imaging element 21 is, for example, a CCD (Charge Coupled Device) image sensor and a CMOS (Complementary Metal Oxide Semiconductor) image sensor. The imaging element 21 images an optical image formed on a light receiving surface and thereby generates an image signal. A first connector 22 for electrical connection to the second substrate 13 may be mounted on the first substrate 12 at a rear surface of the surface on which the imaging element 21 is mounted.

Figure 5:
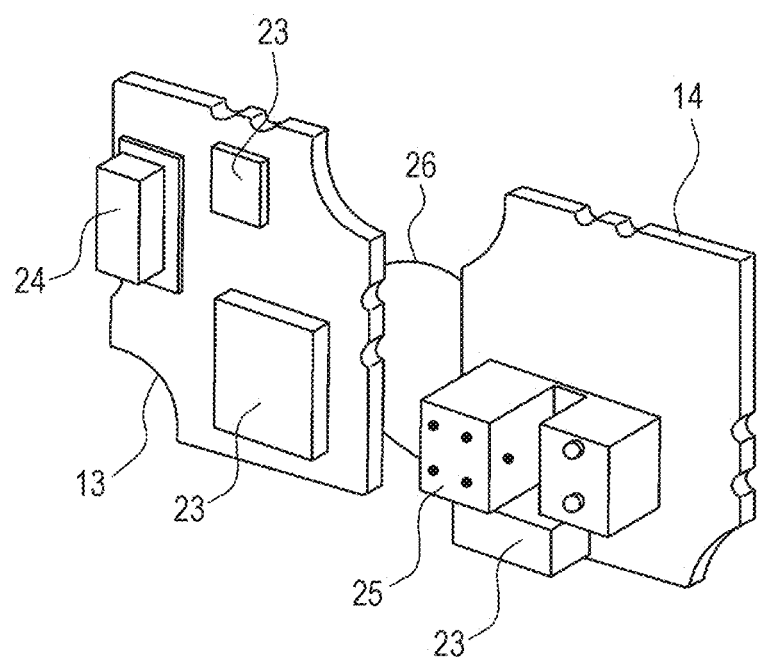
FIG. 5 is a perspective view illustrating appearances of a second substrate and a third substrate in FIG. 2 and FIG. 3.

As illustrated in FIG. 5, the second substrate 13 has a flat shape. The second substrate 13 may have a substantially rectangular shape. An electronic component 23 is mounted on at least one main surface of the second substrate 13. The electronic component 23 drives the imaging element 21 or processes an image signal generated by the imaging element 21. A second connector 24 for electrical connection to the first connector 22 may be mounted on one main surface of the second substrate 13.

The third substrate 14 has a flat shape. The third substrate 14 may have a substantially rectangular shape. An electronic component 23 is mounted on at least one main surface of the third substrate 14. The electronic component 23 drives the imaging element 21 or processes an image signal generated by the imaging element 21. A third connector 25 for electrical connection to the second housing 20 may be mounted on one main surface of the third substrate 14.

The third substrate 14 may be electrically connected to the second substrate 13 by a flexible substrate 26. The third connector 25 may be mounted on a main surface of the third substrate 14 on the same side as the second connector 24 in a state in which the entirety of the flexible substrate 26 is extended in a flat shape.

As illustrated in FIG. 2 and FIG. 3, in the electronic device 10, the first substrate 12, the second substrate 13, and the third substrate 14 are positioned toward a stacking direction in order with respective main surfaces facing each other.

Figure 6:
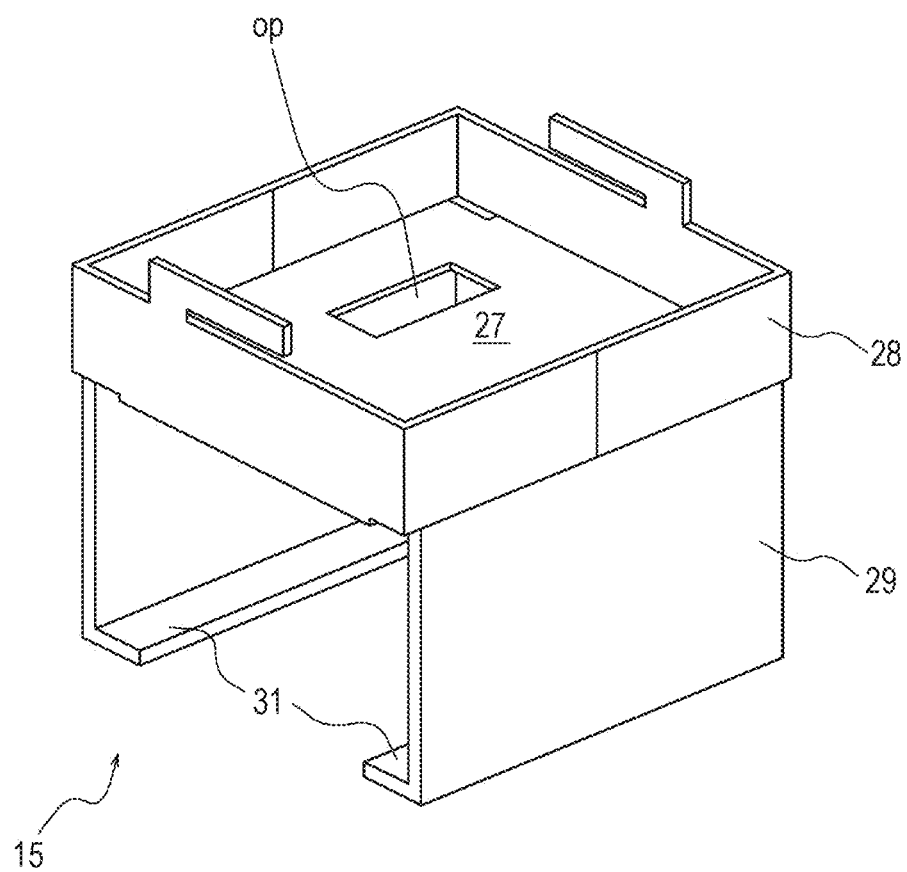
FIG. 6 is a perspective view illustrating an appearance of a first metal plate in FIG. 2 and FIG. 3.

As illustrated in FIG. 6, the first metal plate 15 includes a first flat portion 27 and a first shield portion 28. The first metal plate 15 may further include a third shield portion 29.

The first flat portion 27 has a flat shape. The first flat portion 27 may have a substantially rectangular shape wider than the first substrate 12, the second substrate 13, and the third substrate 14. As illustrated in FIG. 2 and FIG. 3, in the electronic device 10, the first flat portion 27 is interposed between the first substrate 12 and the second substrate 13. In the electronic device 10, the first flat portion 27 may have a main surface substantially parallel to main surfaces of the first substrate 12 and the second substrate 13.

In the electronic device 10, the first flat portion 27 directly or indirectly abuts the electronic component 23 mounted on the first substrate 12 and the electronic component 23 mounted on the second substrate 13. In the electronic device 10, the first flat portion 27, for example, abuts the imaging element 21 as an electronic component indirectly via a heat dissipation sheet 30 and the first substrate 12. In the electronic device 10, the first flat portion 27, for example, abuts the electronic component 23 mounted on the second substrate 13 indirectly via the heat dissipation sheet 30. The heat dissipation sheet 30 may be made of, for example, a soft material having shape followability, like filler-containing silicone rubber, and having relatively large thermal conductivity.

As illustrated in FIG. 6, an opening op may be provided in the first flat portion 27. The opening op may be larger than the first connector 22 viewed in a direction perpendicular to a main surface of the first substrate 12. As illustrated in FIG. 2, in the electronic device 10, the first connector 22 may be inserted into the opening op. In the electronic device 10, the second connector 24 may be connected to the first connector 22 inserted into the opening op.

As illustrated in FIG. 6, the first shield portion 28 stands along the whole extent of the outer edge of the first flat portion 27 on the side of a main surface of the first flat portion 27 facing the first substrate 12. As illustrated in FIG. 2 and FIG. 3, in the electronic device 10, the first shield portion 28 covers the entire circumference of the side surface of the first substrate 12.

As illustrated in FIG. 6, the third shield portion 29 may stand along two parallel sides of the first flat portion 27 on a side opposite to the main surface at which the first shield portion 28 of the first flat portion 27 stands. As illustrated in FIG. 2, in the electronic device 10, the third shield portion 29 may cover, of side surfaces of the second substrate 13 and the third substrate 14, at least a part exposed from the second shield portion, which will be described later. In the electronic device 10, the third shield portion 29 may cover the flexible substrate 26 when viewed in a direction perpendicular to the stacking direction.

The third shield portion 29 may include a first leg portion 31 at an end on the side of the stacking direction, in other words, in a direction away from the first flat portion 27. The first leg portion 31 may be parallel to the first flat portion 27. The first leg portion 31 may overlap the first flat portion 27 when viewed in a direction perpendicular to the first flat portion 27. As illustrated in FIG. 2, inside the electronic device 10, the third shield portion 29 may abut the heat conductor 17 at the first leg portion 31.

Figure 7:
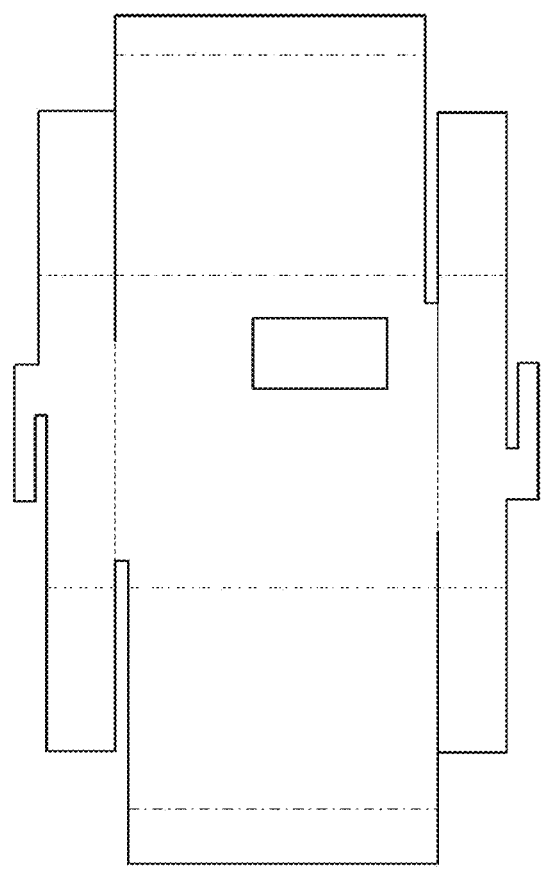
FIG. 7 is a development plan view of the first metal plate in FIG. 6.

The first metal plate 15 is a metal plate, in other words, a metal flat plate having a desired shape such as that illustrated in FIG. 7 and whose predetermined portions are bent. In FIG. 7, straight lines to be bent on the surface side are indicated by dashed lines, and straight lines to be bent on the rear surface side are indicated by one-dot chain lines. When the bent portions of the first metal plate 15 are unbent into a flat shape, all of parts of the first metal plate 15 are thus separated from each other without interfering with each other. The first metal plate 15 may be made of, for example, a metal such as copper or the like having large thermal conductivity.

Figure 8:
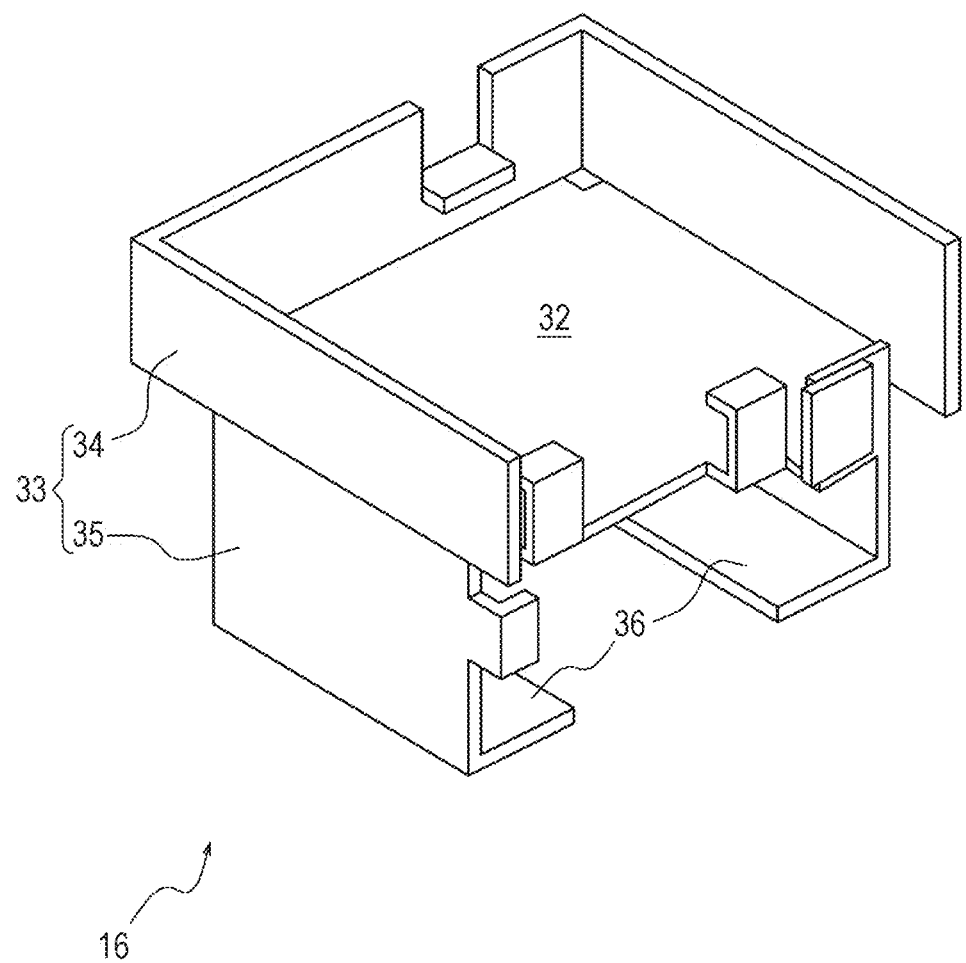
FIG. 8 is a perspective view illustrating an appearance of a second metal plate in FIG. 2 and FIG. 3.

As illustrated in FIG. 8, the second metal plate 16 includes a second flat portion 32 and a second shield portion 33.

The second flat portion 32 has a flat shape. The second flat portion 32 may have a substantially rectangular shape wider than the first substrate 12, the second substrate 13, and the third substrate 14 and slightly narrower than the first flat portion 27. As illustrated in FIG. 2 and FIG. 3, in the electronic device 10, the second flat portion 32 is interposed between the second substrate 13 and the third substrate 14. In the electronic device 10, the second flat portion 32 may have a main surface substantially parallel to main surfaces of the second substrate 13 and the third substrate 14.

In the electronic device 10, the second flat portion 32 directly or indirectly abuts the electronic component 23 mounted on the second substrate 13 and the electronic component 23 mounted on the third substrate 14. In the electronic device 10, the second flat portion 32, for example, abuts the electronic component 23 mounted on the second substrate 13 indirectly via the heat dissipation sheet 30. In the electronic device 10, the second flat portion 32, for example, abuts the electronic component 23 mounted on the third substrate 14 indirectly via the heat dissipation sheet 30. The heat dissipation sheet 30 may be made of, for example, a soft material having shape followability, like filler-containing silicone rubber, and having relatively large thermal conductivity.

As illustrated in FIG. 8, the second shield portion 33 includes a first one-side shield portion 34 and a second one-side shield portion 35. The first one-side shield portion 34 stands, on one main surface of the second flat portion 32, along at least a portion of the outer edge of the second flat portion 32. The second one-side shield portion 35 stands, on the other main surface of the second flat portion 32, along at least a portion of the outer edge of the second flat portion 32.

For example, the first one-side shield portion 34 stands, on the side of one main surface (the upper side in FIG. 8), along three sides except for one side of the second flat portion 32. For example, the second one-side shield portion 35 stands, on the side of the other main surface (the lower side in FIG. 8), along two mutually facing sides of the three sides along which the first one-side shield portion 34 stands on the side of the one main surface.

As illustrated in FIG. 2 and FIG. 3, in the electronic device 10, the second shield portion 33 covers at least portions of side surfaces of the second substrate 13 and the third substrate 14. As illustrated in FIG. 2, in the electronic device 10, the second shield portion 33 may cover portions of side surfaces of the second substrate 13 and the third substrate 14 and expose other portions without covering the other portions.

As illustrated in FIG. 8, the second one-side shield portion 35 may include a second leg portion 36 at an end on the side of the stacking direction, in other words, in a direction away from the second flat portion 32. The second leg portion 36 may be parallel to the second flat portion 32. The second leg portion 36 may overlap the second flat portion 32 when viewed in a direction perpendicular to the second flat portion 32. As illustrated in FIG. 3, inside the electronic device 10, the second shield portion 33 may abut the heat conductor 17 at the second leg portion 36.

Figure 9:
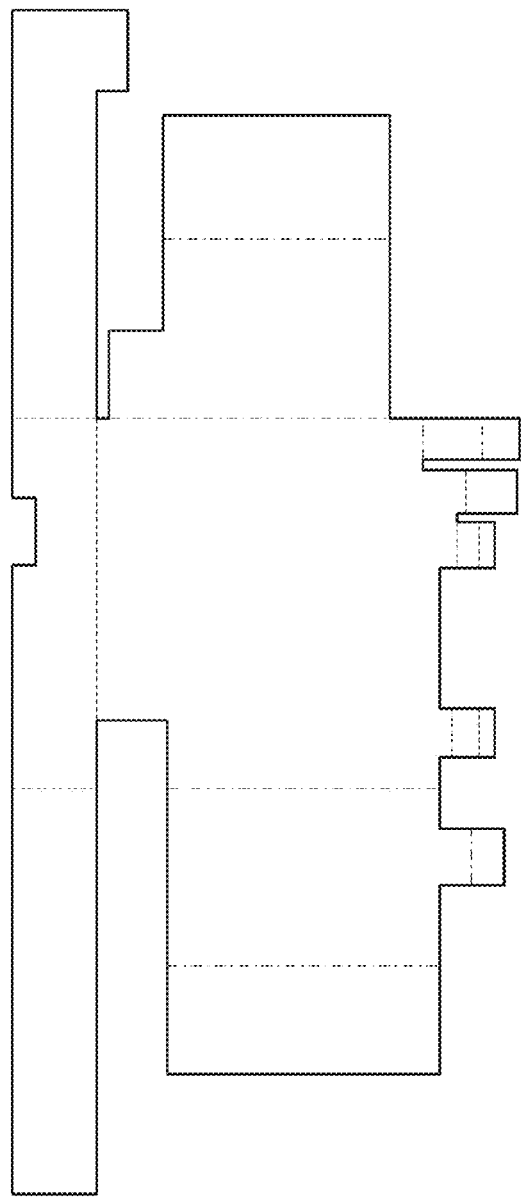
FIG. 9 is a development plan view of the second metal plate in FIG. 8.

The second metal plate 16 is a metal plate, in other words, a metal flat plate having a desired shape such as that illustrated in FIG. 9 and whose predetermined portions are bent. In FIG. 9, straight lines to be bent on the surface side are indicated by dashed lines, and straight lines to be bent on the rear surface side are indicated by one-dot chain lines. When the bent portions of the second metal plate 16 are unbent into a flat shape, all of parts of the second metal plate 16 are thus separated from each other without interfering with each other. The second metal plate 16 may be made of, for example, a metal such as copper or the like having large thermal conductivity.

As illustrated in FIG. 2 and FIG. 3, the second metal plate 16 may be positioned to be separated from the first metal plate 15 without being in contact with the first metal plate 15 at the all surfaces of the second metal plate 16.

As illustrated in FIG. 2 and FIG. 3, the heat conductor 17 is positioned on the side of the stacking direction from the first substrate 12. The heat conductor 17 may be positioned on the side of the stacking direction from the third substrate 14. In the electronic device 10, the heat conductor 17 may abut the first metal plate 15 and the second metal plate 16. As illustrated in FIG. 2, the heat conductor 17 may abut the first metal plate 15 at the first leg portion 31. As illustrated in FIG. 3, the heat conductor 17 may abut the second metal plate 16 at the second leg portion 36.

As illustrated in FIG. 2 and FIG. 3, the heat conductor 17 may include a third metal plate 37 and a heat dissipation sheet 38. The heat conductor 17 may abut the first metal plate 15 and the second metal plate 16 at the heat dissipation sheet 38. The heat dissipation sheet 38 may abut the third metal plate 37 at a surface that differs from a surface that abuts the first metal plate 15 and the second metal plate 16. The heat dissipation sheet 38 may be made of, for example, a soft material having shape followability, like filler-containing silicone rubber, and having relatively large thermal conductivity. In the electronic device 10, the third metal plate 37 extends toward the side of the stacking direction more than the surface that abuts the first metal plate 15 and the second metal plate 16. The third metal plate 37 may be made of, for example, a metal such as copper or the like having large thermal conductivity.

The imaging optical system 18 is constituted by an optical element such as a lens. The imaging optical system 18 is designed and formed to have predetermined values of optical characteristics such as angle of field, depth of field, and the like. The imaging optical system 18 forms an imaged subject image on a light receiving surface of the imaging element 21.

Figure 10:
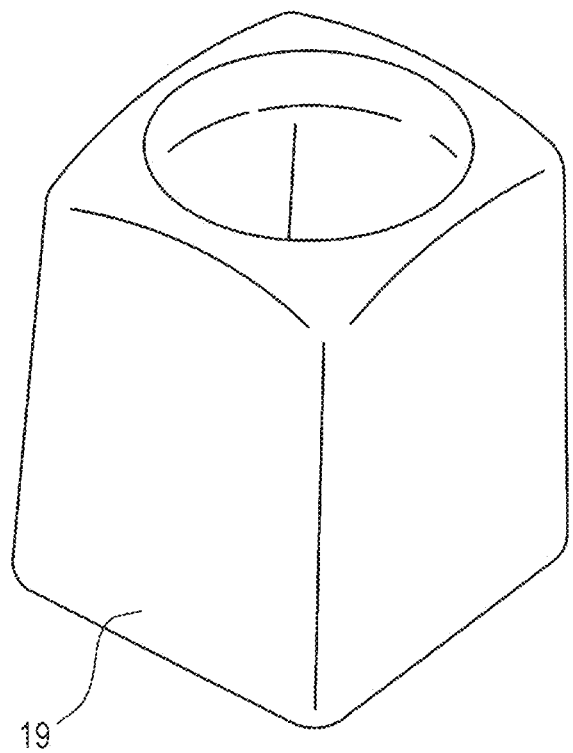
FIG. 10 is a perspective view illustrating an appearance of a first housing in FIG. 2 and FIG. 3.

As illustrated in FIG. 10, the first housing 19 may have a rectangular cylindrical section. As illustrated in FIG. 2 and FIG. 3, the first housing 19 may house the imaging optical system 18 with the optical axis of the imaging optical system 18 substantially coinciding with the axis of the first housing 19 and with the imaging optical system 18 being exposed from one opening. The first housing 19 may house the first substrate 12 such that the imaging element 21 is fixed in an orientation determined at a positioned that is determined relative to the imaging optical system 18. The first housing 19 may house the second substrate 13, the third substrate 14, the first metal plate 15, and the second metal plate 16 such that the above configuration is satisfied for the first substrate 12.

Figure 11:
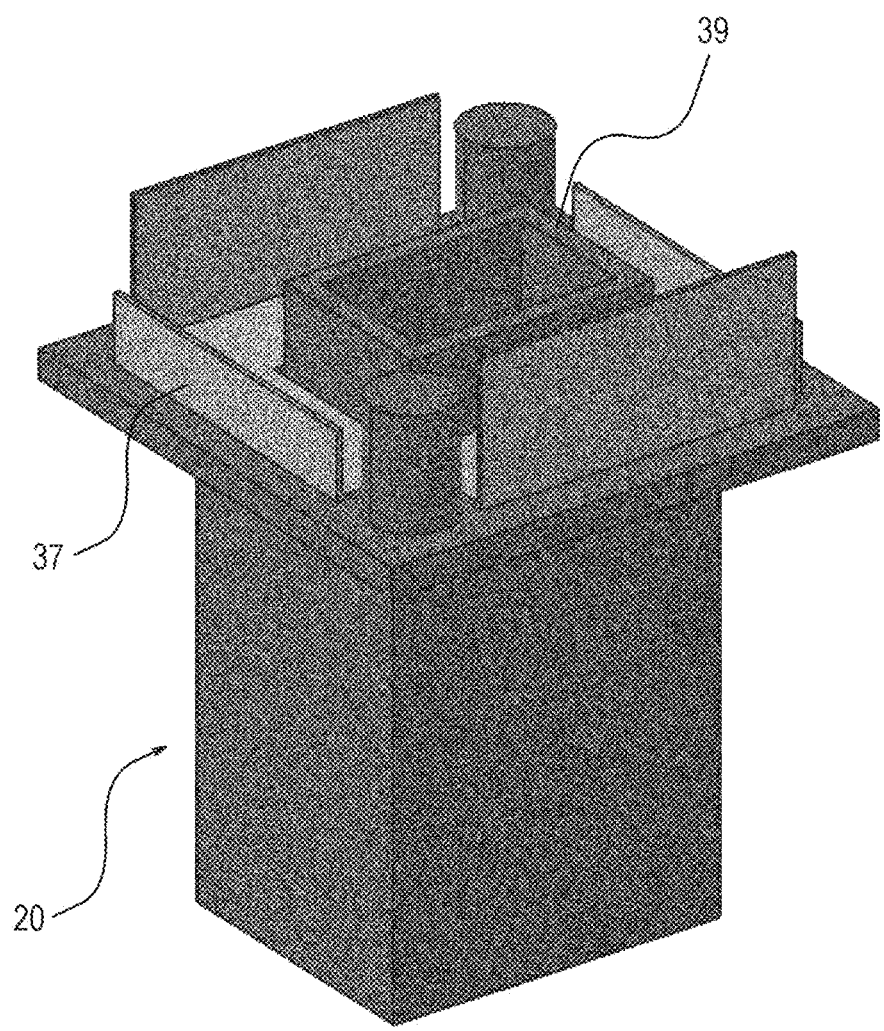
FIG. 11 is a perspective view illustrating an appearance of a second housing in FIG. 2 and FIG. 3.

As illustrated in FIG. 11, the second housing 20 may have a shape including a flat part and a quadrangular prism that extends perpendicular to a main surface of the flat part. The second housing 20 may include the third metal plate 37 as the heat conductor 17. The second housing 20 may include a fourth connector 39 that can be fitted to the third connector 25. As illustrated in FIG. 2 and FIG. 3, the second housing 20 may be sealed at the flat part to an opening of the first housing 19 at an end on a side opposite to an end on a side that exposes the imaging optical system 18.

Next, a method of manufacturing the electronic device 10 will be described below.

Figure 12:
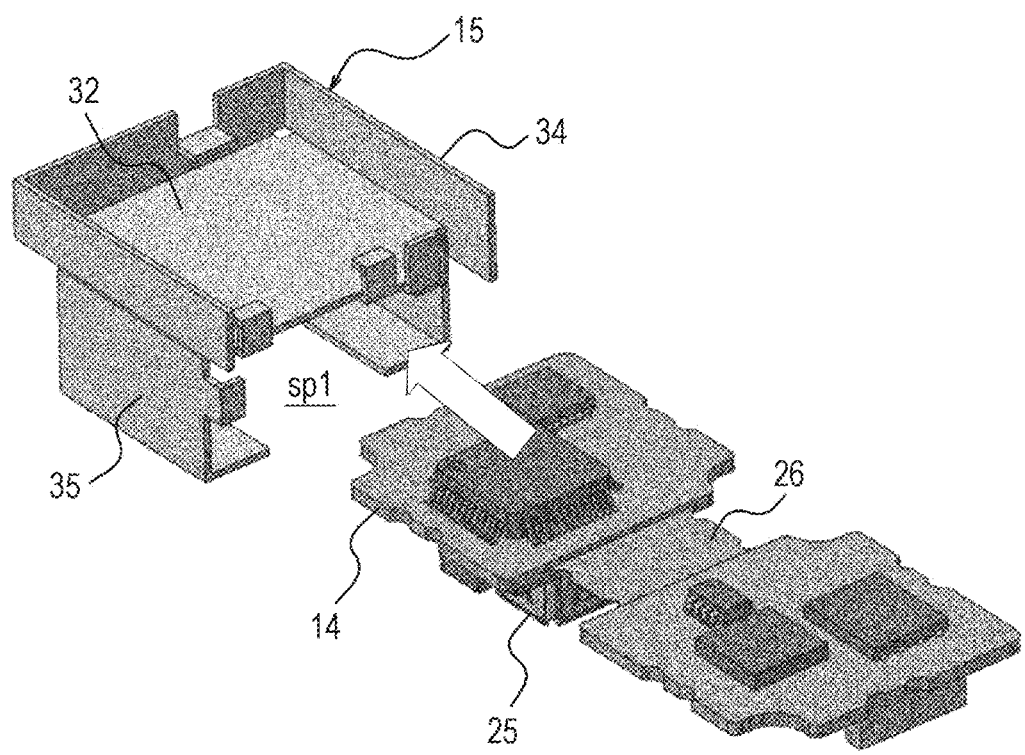
FIG. 12 illustrates a method of manufacturing the electronic device in FIG. 2 and FIG. 3 and illustrates a step of assembling a second substrate and a third substrate to a second metal plate.

As illustrated in FIG. 12, the third substrate 14 is inserted into a space sp1 defined by the second flat portion 32 and the second one-side shield portion 35 of the second metal plate 16. The third substrate 14 is inserted into the space sp1 from an outer edge side of the second flat portion 32 where the first one-side shield portion 34 is not provided. The third substrate 14 is inserted such that a main surface opposite to a main surface provided with the third connector 25 faces the second flat portion 32. The third substrate 14 is inserted into the space sp1 from a side opposite to a side where the flexible substrate 26 is provided.

Figure 13:
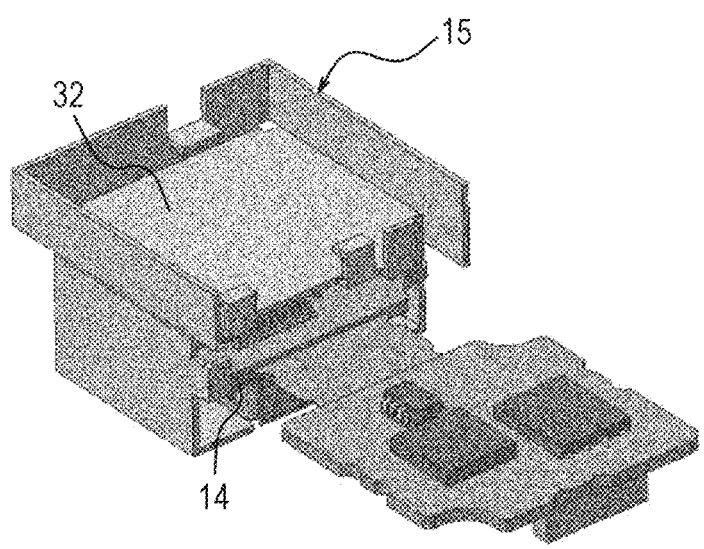
FIG. 13 illustrates a method of manufacturing the electronic device in FIG. 2 and FIG. 3 and illustrates another step of assembling a second substrate and a third substrate to a second metal plate.
Figure 14:
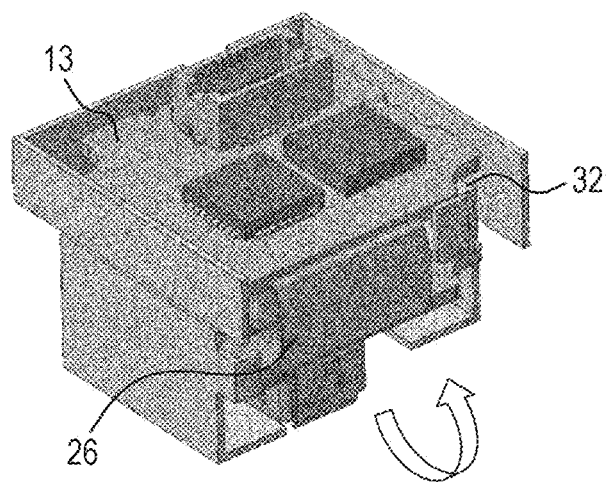
FIG. 14 illustrates a method of manufacturing the electronic device in FIG. 2 and FIG. 3 and illustrates yet another step of assembling a second substrate and a third substrate to a second metal plate.

As illustrated in FIG. 13, the third substrate 14 in the inserted state is stuck to the second flat portion 32. The heat dissipation sheet 30 may be used to stick the third substrate 14 to the second flat portion 32. As illustrated in FIG. 14, the flexible substrate 26 is folded, and the second substrate 13 is stuck to the second flat portion 32. The heat dissipation sheet 30 may be used to stick the second substrate 13 to the second flat portion 32.

Figure 15:
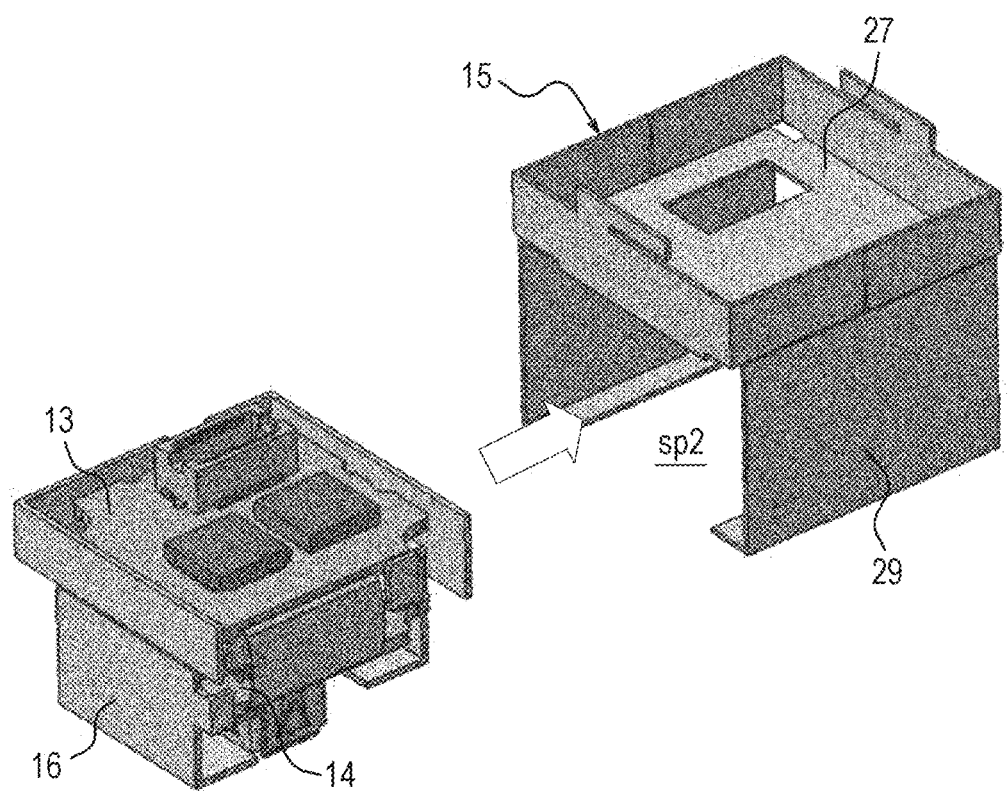
FIG. 15 illustrates a method of manufacturing the electronic device in FIG. 2 and FIG. 3 and illustrates a step of assembling a second substrate and a third substrate to a first metal plate.

As illustrated in FIG. 15, the second metal plate 16 to which the second substrate 13 and the third substrate 14 are stuck is inserted into a space sp2 defined by the first flat portion 27 and the third shield portion 29 of the first metal plate 15. The second metal plate 16 is inserted such that the second substrate 13 faces the first flat portion 27.

Figure 16:
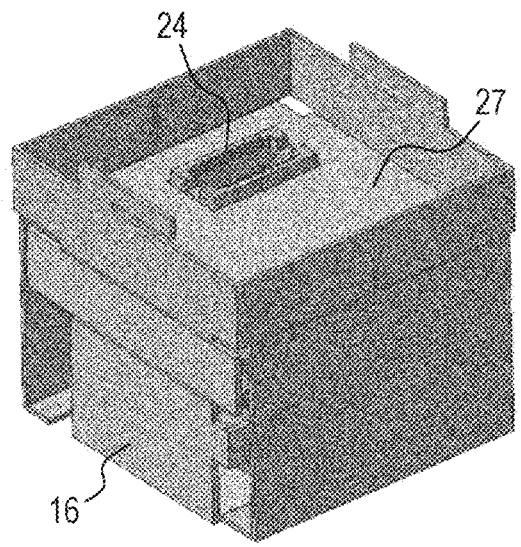
FIG. 16 illustrates a method of manufacturing the electronic device in FIG. 2 and FIG. 3 and illustrates another step of assembling a second substrate and a third substrate to a first metal plate.

As illustrated in FIG. 16, the second metal plate 16 is stuck to the first flat portion 27 via the second substrate 13 in a state in which the second connector 24 of the second substrate 13 is inserted into the opening op of the first flat portion 27. The heat dissipation sheet 30 may be used to stick the second substrate 13 to the first flat portion 27.

Figure 17:
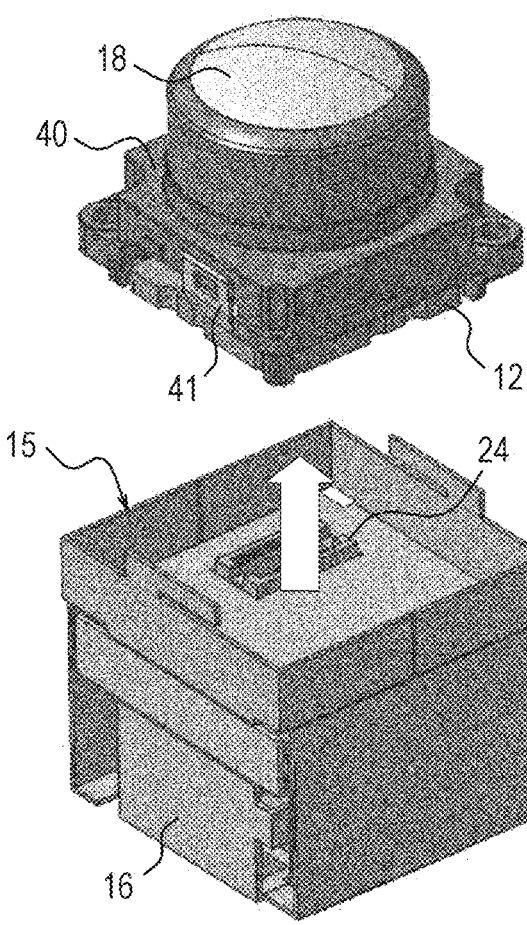
FIG. 17 illustrates a method of manufacturing the electronic device in FIG. 2 and FIG. 3 and illustrates a step of electrically connecting a first substrate and a second substrate to each other.

As illustrated in FIG. 17, the second substrate 13 assembled to the first metal plate 15 and the second metal plate 16 is connected to the first substrate 12 by the second connector 24 being fitted to the first connector 22. Before the connection, the first substrate 12 is fixed to a lens barrel 40 housing the imaging optical system 18 while a heat conduction member 41 such as a metal plate being interposed therebetween. For example, bonding with an adhesive, fastening with a screw, and the like are employed for fixation of the first substrate 12 to the lens barrel 40.

Figure 18:
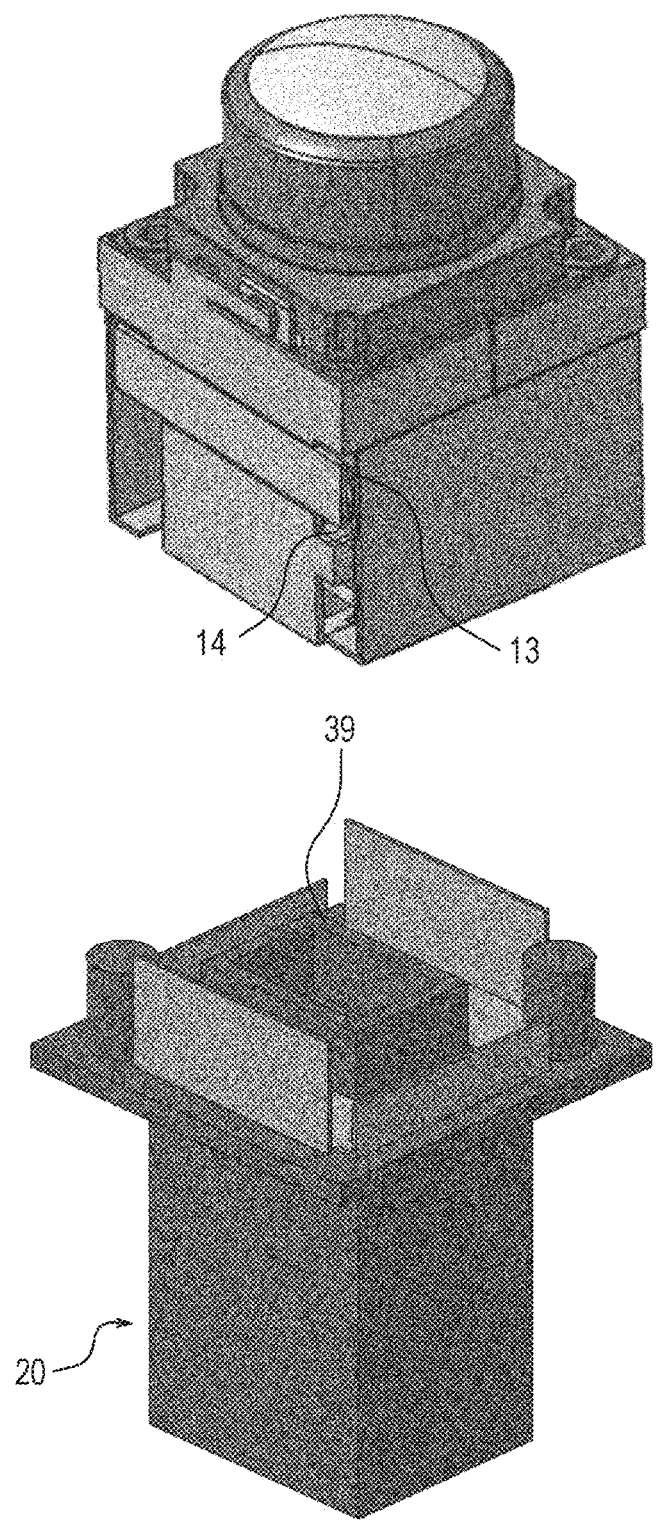
FIG. 18 illustrates a method of manufacturing the electronic device in FIG. 2 and FIG. 3 and illustrates a step of assembling a third substrate to a second housing.

As illustrated in FIG. 18, the third substrate 14 is connected to the second housing 20 by the third connector 25 being fitted to the fourth connector 39 in a state in which the second substrate 13 is connected to the first substrate 12. Thereafter, the first housing 19 is placed over the imaging optical system 18, the first substrate 12, the second substrate 13, the third substrate 14, the first metal plate 15, and the second metal plate 16. In the state in which the first housing 19 is placed, the first housing 19 is fixed to the second housing 20, and the electronic device 10 is thereby manufactured. For example, welding, bonding with an adhesive, fastening with a screw, and the like are employed for fixation of the first housing 19 and the second housing 20.

The electronic device 10 in the present embodiment with the above configuration includes the first flat portion 27 that is interposed between the first substrate 12 and the second substrate 13 and that indirectly abuts the imaging element 21 mounted on the first substrate 12 and the electronic component 23 mounted on the second substrate 13. In the electronic device 10 with such a configuration, the imaging element 21 mounted on the first substrate 12 and the electronic component 23 mounted on the second substrate 13, which are heat sources, are close to the first flat portion 27, which generally has thermal conductivity higher than that of the heat dissipation sheet 30. Thus, heat dissipation properties are improved compared with a configuration in which only the heat dissipation sheet 30 is interposed. In addition, the electronic device 10 includes the second flat portion 32 that is interposed between the second substrate 13 and the third substrate 14 and that indirectly abuts the electronic component 23 mounted on the second substrate 13 and the electronic component 23 mounted on the third substrate 14. In the electronic device 10 with such a configuration, the electronic component 23 mounted on the second substrate 13 and the electronic component 23 mounted on the third substrate 14, which are heat sources, are close to the second flat portion 32, which generally has heat dissipation properties higher than that of the heat dissipation sheet 30. Thus, heat dissipation properties are improved compared with a configuration in which only the heat dissipation sheet 30 is interposed.

The electronic device 10 according to the present embodiment further includes the first shield portion 28 that covers the entire circumference of the side surface of the first substrate 12. With such a configuration, the electronic device 10 can have shielding properties with respect to radiation noise of the first substrate 12 or the electronic component 23 mounted on the first substrate 12. In addition, the electronic device 10 includes the second shield portion 33 that covers at least portions of the side surfaces of the second substrate 13 and the third substrate 14. With such a configuration, the electronic device 10 can have shielding properties with respect to radiation noise of the electronic component 23 mounted on the second substrate 13 and the electronic component 23 mounted on the third substrate 14.

In the electronic device 10 according to the present embodiment, the first metal plate 15 includes the first flat portion 27 and the first shield portion 28. In addition, in the electronic device 10, the second metal plate 16 includes the second flat portion 32 and the second shield portion 33. In the electronic device 10 with such a configuration, the first flat portion 27 and the first shield portion 28 having the above configuration and the second flat portion 32 and the second shield portion 33 having the above configuration can be manufactured in a simple configuration without being subjected to steps of welding and the like.

Therefore, as described above, the electronic device 10 according to the present embodiment can further improve heat dissipation properties with a simple configuration while having shielding properties with respect to radiation noise.

In the electronic device 10 according to the present embodiment, the first metal plate 15 and the second metal plate 16 are positioned to be separated from each other. With such a configuration, the electronic device 10 can reduce heat conduction between the first metal plate 15 and the second metal plate 16 compared with a configuration in which the first metal plate 15 and the second metal plate 16 abut each other. Thus, in a configuration in which one of the first metal plate 15 and the second metal plate 16 is close to a component that is to be greatly affected by a high temperature, the electronic device 10 can reduce heat conduction from the other one to the one even when the temperature of the other one is increased.

In the electronic device 10 according to the present embodiment, the second shield portion 33 covers portions of the side surfaces of the second substrate 13 and the third substrate 14, and the third shield portion 29 of the first metal plate 15 covers at least a part exposed from the second shield portion 33. With such a configuration, the electronic device 10 can have shielding properties with respect to radiation noise of the electronic component 23 mounted on the second substrate 13 and the electronic component 23 mounted on the third substrate 14 while enabling the second substrate 13 and the third substrate 14 to be easily stuck to the second metal plate 16, even in a configuration in which the second substrate 13 and the third substrate 14 are connected to each other by a wire or the like, such as the flexible substrate 26, extending from the side surfaces of the second substrate 13 and the third substrate 14.

In the electronic device 10 according to the present embodiment, the flexible substrate 26 that connects the second substrate 13 and the third substrate 14 to each other is covered by the third shield portion 29. With such a configuration, the electronic device 10 can suppress degradation of shielding properties with respect to radiation noise of the electronic component 23 mounted on the second substrate 13 and the electronic component 23 mounted on the third substrate 14 while using the flexible substrate 26 that contributes to easy manufacture and a reduction in manufacturing costs.

The electronic device 10 according to the present embodiment includes the heat conductor 17 that is positioned on the side of the stacking direction from the first substrate 12 and that abuts the first metal plate 15 and the second metal plate 16. With such a configuration, the electronic device 10 can conduct heat generated at the electronic component 23 mounted on the first substrate 12, the electronic component 23 mounted on the second substrate 13, and the electronic component 23 mounted on the third substrate 14 toward the stacking direction. Thus, even in a configuration in which a component that is to be greatly affected by a high temperature, as with the imaging optical system 18 made of a resin, is positioned in a direction opposite the stacking direction, the electronic device 10 can suppress a heat increase of the component.

In the electronic device 10 according to the present embodiment, the third shield portion 29 and the second shield portion 33 abut the heat conductor 17 at the first leg portion 31 and the second leg portion 36, respectively. With such a configuration, the electronic device 10 according to the present embodiment can increase an area of contact between each of the first metal plate 15 and the second metal plate 16, and the heat conductor 17. Thus, the electronic device 10 can improve conduction of the heat generated at the electronic component 23 mounted on the first substrate 12, the electronic component 23 mounted on the second substrate 13, and the electronic component 23 mounted on the third substrate 14 to the heat conductor 17.

In the electronic device 10 according to the present embodiment, the first substrate 12 and the second substrate 13 are electrically connected to each other via the first connector 22 inserted into the opening op provided in the first flat portion 27, and the second connector 24. With such a configuration, the electronic device 10 can allow formation of the first shield portion 28 and the third shield portion 29 that cover the entirety of the side surface of at least one of the first substrate 12 and the second substrate 13. Therefore, the electronic device 10 can cover the entire circumference of the side surface of at least one of the first substrate 12 and the second substrate 13 by using the single first metal plate 15 without using a plurality of metal plates.

Although the present disclosure has been described on the basis of the drawings and the embodiment, it should be noted that it is easy for a person skilled in the art to perform various changes and corrections on the basis of the present disclosure. Accordingly, it should be noted that these changes and corrections are included in the scope of the present disclosure.

For example, in the present embodiment, the second substrate 13 and the third substrate 14 are configured to be connected to each other via the flexible substrate 26. However, an opening may be provided in the second flat portion 32, and the second substrate 13 and the third substrate 14 may be connected to each other by a connector through the opening. In such a configuration, the second shield portion 33 may cover the entire circumference of the side surfaces of the second substrate 13 and the third substrate 14. Since the side surfaces of the second substrate 13 and the third substrate 14 are covered at the entire circumference thereof, the third shield portion 29 may not cover portions of the side surfaces of the second substrate 13 and the third substrate 14. Thus, an electronic device including a plurality of substrates positioned to be side by side toward a stacking direction, a flat portion interposed between, of the plurality of substrates, mutually adjacent two substrates, and a metal plate including a shield portion that covers the entire circumference of side surfaces of the two substrates can further improve heat dissipation properties with a simple configuration while having shielding properties with respect to radiation noise, as described above.

REFERENCE SIGNS LIST 10 electronic device
11 mobile body
12 first substrate
13 second substrate
14 third substrate
15 first metal plate
16 second metal plate
17 heat conductor
18 imaging optical system
19 first housing
20 second housing
21 imaging element
22 first connector
23 electronic component
24 second connector
25 third connector
26 flexible substrate
27 first flat portion
28 first shield portion
29 third shield portion
30 heat dissipation sheet
31 first leg portion
32 second flat portion
33 second shield portion
34 first one-side shield portion
35 second one-side shield portion
36 second leg portion
37 third metal plate
38 heat dissipation sheet
39 fourth connector
40 lens barrel
41 heat conduction member
op opening
sp1 space defined by second flat portion and second one-side shield portion
sp2 space defined by first flat portion and third shield portion

The invention claimed is:

1. An imaging apparatus comprising:
a third substrate including a third connector;
a third shield portion configured to cover a side surface of at least portions of the third substrate;
a leg portion formed at an end of the third shield portion on a side of a direction away from the third substrate;

a fourth connector configured to be able to be fitted to the third connector;
a third metal plate configured to abut the leg portion; and
a second housing including the fourth connector and the third metal plate.

2. The imaging apparatus of claim 1, further comprising a first housing configured to house the third substrate and the third shield portion, and to be sealed to the second housing.

3. The imaging apparatus of claim 1, wherein the third shield portion and the leg portion are formed by bending a metal plate.

4. The imaging apparatus of claim 2, further comprising an imaging optical system including a lens, wherein the first housing houses the imaging optical system with the imaging optical system being exposed from an opening and the second housing is configured to be sealed to an opening of the first housing at an end on a side opposite to an end on a side that exposes the imaging optical system.

5. The imaging apparatus of claim 4, further comprising a first substrate on which an imaging element is mounted, wherein the imaging optical system forms an imaged subject image on a light receiving surface of the imaging element.

* * * * *